(12) United States Patent
Wang et al.

(10) Patent No.: US 12,372,552 B2
(45) Date of Patent: Jul. 29, 2025

(54) DETECTION MECHANISM, WIRE POSITIONING APPARATUS, AND WIRE PROCESSING DEVICE

(71) Applicant: TYCO ELECTRONICS (SHANGHAI) CO., LTD., Shanghai (CN)

(72) Inventors: Zhen Wang, Shanghai (CN); Yiqun (Cham) Zhu, Shanghai (CN)

(73) Assignee: TYCO ELECTRONICS (SHANGHAI) CO., LTD., Shanghai (CN)

( * ) Notice: Subject to any disclaimer, the term of this patent is extended or adjusted under 35 U.S.C. 154(b) by 673 days.

(21) Appl. No.: 17/547,390

(22) Filed: Dec. 10, 2021

(65) Prior Publication Data

US 2022/0187339 A1 Jun. 16, 2022

(30) Foreign Application Priority Data

Dec. 15, 2020 (CN) .......................... 202011473364.3

(51) Int. Cl.
*G01R 1/073* (2006.01)
*G01R 1/067* (2006.01)

(52) U.S. Cl.
CPC ..... *G01R 1/07342* (2013.01); *G01R 1/06716* (2013.01)

(58) Field of Classification Search
None
See application file for complete search history.

(56) References Cited

U.S. PATENT DOCUMENTS 8,482,292 B2 * 7/2013 Tsubota ................. G01R 31/58
324/538
2003/0029574 A1 2/2003 Matsuzawa et al.
(Continued)

FOREIGN PATENT DOCUMENTS

CN 203881862 U 10/2014
CN 105938941 A 9/2016
(Continued)

OTHER PUBLICATIONS

Wang; A Battery Voltage Detecting Device of a Low Power Consumption; Date Published May 8, 2020; CN 210487851 U; Wuxi Vocational Inst Commerce; IPC G01R1/04; G01R19/OO (Year: 2020).*

(Continued)

*Primary Examiner* — Nasima Monsur
(74) *Attorney, Agent, or Firm* — Potomac Law Group, PLLC

(57) ABSTRACT

A detection mechanism for a conducting wire positioning apparatus. The detection mechanism having an electrically conductive assembly, a displacement assembly, and a detection circuit. The electrically conductive assembly has at least two electrically conductive probes, which are configured to be in electric connection with the exposed conductor portion by contacting with the exposed conductor portion. The displacement assembly is configured to drive the electrically conductive assembly to switch between a separated position and a contact position. When the at least two electrically conductive probes are in contact with the exposed conductor portion, the detection circuit is conducted, indicating that the exposed conductor portion is located at the designated position. When the number of electrically conductive probes in contact with the exposed conductor portion of the conducting wire is less than two, the detection circuit is disconnected, indicating the exposed conductor portion is not located at the designated location.

9 Claims, 6 Drawing Sheets

(56) References Cited

U.S. PATENT DOCUMENTS

| | | | | |
|---|---|---|---|---|
| 2008/0231300 A1* | 9/2008 | Yamada | .............. | G01R 31/2891 |
| | | | | 324/756.03 |
| 2015/0028907 A1* | 1/2015 | Shinohara | .......... | G01R 31/2886 |
| | | | | 324/750.2 |
| 2015/0241502 A1* | 8/2015 | Mabuchi | ................ | G01R 31/52 |
| | | | | 324/543 |
| 2016/0170064 A1* | 6/2016 | Romeo | .................. | G01R 27/02 |
| | | | | 324/691 |
| 2020/0204028 A1* | 6/2020 | Mizushima | .............. | H02K 3/28 |

FOREIGN PATENT DOCUMENTS

| | | |
|---|---|---|
| CN | 109546821 A | 3/2019 |
| CN | 109581007 A | 4/2019 |
| CN | 109638614 A | 4/2019 |
| CN | 209513912 U | 10/2019 |
| CN | 210487851 U | 5/2020 |
| CN | 214847903 U | 11/2021 |

OTHER PUBLICATIONS

Office Action for Chinese Patent Application No. 202011473364.3 issued on Dec. 28, 2024 (includes English language translation).

\* cited by examiner

DETECTION MECHANISM, WIRE POSITIONING APPARATUS, AND WIRE PROCESSING DEVICE

TECHNICAL FILED

The present application relates to the technical field of the conducting wire splicing, and more particularly to a detection mechanism, a conducting wire positioning apparatus for a conducting wire processing device, and the conducting wire processing device.

BACKGROUND OF INVENTION

When splicing two bundles of conducting wire, it is required to peel off a section of insulation peel of the respective bundles of conducting wire to expose exposed conductor portions. Each bundle of conducting wire may be composed of a single conducting wire, or multiple conducting wires, either. The exposed conduction portions of the two bundles of conducting wire are spliced together by ultrasonic welding, and then wrapped with a section of heat-shrinkable sleeve. During processing, the insulated heat-shrinkable sleeve is heated to wrap around or adhere to the two bundles of conducting wire, to wrap the exposed conductor portion therein. In the automatic processing procedure, it is required to fix the two bundles of conducting wire and make the exposed conductor portion locate at a designated position, so as to wrap the insulated heat-shrinkable sleeve around the exposed conductor portion. Generally, the heat-shrinkable sleeve is positioned by a conducting wire positioning apparatus for a conducting wire processing device. A detection mechanism of the conducting wire positioning apparatus for the conducting wire processing device is employed to make the exposed conductor portion locate at a designated position, and the heat-shrinkable sleeve is pushed to the designated position by adopting a pushing mechanism of the conducting wire positioning apparatus for the conducting wire processing device, so that the heat-shrinkable sleeve wraps around the exposed conductor portion. Currently, the conducting wire is manually placed to make the exposed conductor portion at the designated position, and how to automatically detect and determine whether the exposed conductor portion is at the designated position is one of the technical problems that need to be solved in this field.

SUMMARY OF INVENTION

It is an object of the present application to provide a detection mechanism, a conducting wire positioning apparatus for a conducting wire processing device, and the conducting wire processing device, which aim at solving the technical problem that the existing technology fails to detect and determine whether the exposed conductor portion is located at a designated position.

Technical solutions of the present application are achieved as follows:

A first aspect of the present application provides a detection mechanism for detecting an exposed conductor portion of a conducting wire, comprising: an electrically conductive assembly, a displacement assembly, and a detection circuit.

The electrically conductive assembly comprises at least two electrically conductive probes. The at least two electrically conductive probes are spacedly arranged and are configured to be in electric connection with the exposed conductor portion by contacting with the exposed conductor portion.

The displacement assembly is configured to drive the electrically conductive assembly to switch between a separated position and a contact position. A moving path of the electrically conductive assembly is a straight line. When the electrically conductive assembly is located at the contact position, the at least two electrically conductive probes are in contact with the conducting wire. When the electrically conductive assembly is at a separated position, the at least two electrically conductive probes are separated from the conducting wire.

The detection circuit is in electric connection with the at least two electrically conductive probes. When the electrically conductive assembly is located at the contact position, the detection circuit is configured to detect and determine whether the exposed conductor portion of the conducting wire is located at a designated position.

When the at least two electrically conductive probes are all in electric connection with the exposed conductor portion of the conducting wire, the detection circuit is turned on, and it is determined that the exposed conductor portion is located at the designated position. When less than two electrically conductive probes are in electric connection with the exposed conductor portion of the conducting wire, it is determined that the exposed conductor portion is not located at the designated location.

In an embodiment of the first aspect, the moving path of the electrically conductive assembly between the separated position and the contact position is perpendicular to an extension direction of the conducting wire.

In an embodiment of the first aspect, the detection mechanism further comprises a regulator assembly. The regulator assembly is configured to adjust positions of the electrically conductive probes in an extension direction of the conducting wire.

In an embodiment of the first aspect, the regulator assembly further comprises: at least one first guide pole and at least one slide block. The at least one first guide pole is arranged in a rotatable manner. An extension direction of the at least one first guide pole is the same as the extension direction of the conducting wire, and the electrically conductive assembly is connected to the at least one slide block.

In an embodiment of the first aspect, the number of the at least one first guide pole is one. The number of the at least one slide block is two. The first guide pole has a first threaded section and a second threaded section, a thread direction of the first threaded section is opposite to a thread direction of the second threaded section, and the two slide blocks are respectively in threaded connection with the first threaded section and the second threaded section.

In an embodiment of the first aspect, the number of the at least one first guide pole is two. The number of the at least one slide block is two. The two slide blocks are respectively in threaded connection with the two first guide poles.

In an embodiment of the first aspect, the regulator assembly further comprises a second guide pole and a first mounting seat. The at least one first guide pole is in connection with the first mounting seat. The first mounting seat is in movable connection with the second guide pole. The first mounting seat is configured to move along an extension direction of the second guide pole.

In an embodiment of the first aspect, the second guide pole is in threaded connection with the first mounting seat. The second guide pole is configured to drive the first mounting seat to move along the extension direction of the second guide pole by rotating around an axis of the second guide pole.

In an embodiment of the first aspect, the detection mechanism further comprises a first scale in connection with the first mounting seat. The first scale is configured to indicate the positions of the electrically conductive probes.

In an embodiment of the first aspect, the regulator assembly further comprises a second mounting seat. The second guide pole is in connection with the second mounting seat. The displacement assembly is configured to drive the second mounting seat to move away from or close to the conducting wire, such that the electrically conductive assembly switches between the separated position and the contact position.

In an embodiment of the first aspect, the detection mechanism further comprises a guide rail. The second mounting seat is in slidable connection with the guide rail.

In an embodiment of the first aspect, the detection mechanism further comprises a second scale in connection with the second mounting seat. The second scale is configured to indicate a position of the first mounting seat.

In an embodiment of the first aspect, the electrically conductive assembly further comprises probe holders in connection with the regulator assembly. The electrically conductive probes are in rotatable connection with the probe holders, respectively. The electrically conductive probes elastically abut against the conducting wire when the electrically conductive assembly is located at the contact position.

In an embodiment of the first aspect, the electrically conductive probes are in rotatable connection with the probe holders, respectively. The electrically conductive assembly further comprises at least two first elastic members in connection with the electrically conductive probes, respectively. The at least two first elastic members are configured to be elastically deformed and provide elastic forces to restore the electrically conductive probes, respectively, when the electrically conductive assembly is located at the contact position.

In an embodiment of the first aspect, the displacement assembly comprises a displacement driver. The displacement driver is configured to drive the electrically conductive assembly and the regulator assembly to move along a straight line, and to enable the electrically conductive assembly to switch between the separated position and the contact position.

According to a second aspect, the present application further provides a conducting wire positioning apparatus for a conducting wire processing device, comprising: a pushing mechanism, and the detection mechanism as described in the above. The pushing mechanism is configured to push a heat-shrinkable sleeve sleeved outside the conducting wire to a preset position.

In an embodiment of the second aspect, the pushing mechanism is one of two pushing mechanisms. Each of the two pushing mechanisms comprises a driver assembly and a pair of pushing assemblies. The driver assembly is in connection with the pair of pushing assemblies and is configured to drive the pair of pushing assemblies to move towards or away from each other such that the heat-shrinkable sleeve moves to the preset position.

In an embodiment of the second aspect, each pushing assembly comprises: a connector piece, a pressing member, and a second elastic member. The connector piece is driven by driver assembly to move towards or away from the preset position. The second elastic member is connected between the connector piece and the pressing member. The pressing member is in slidable connection with the connector piece and is located at a side of the connector piece facing the preset position. The second elastic member is configured to apply an elastic force to the pressing member to enable the pressing member to move away from the connector piece.

In an embodiment of the second aspect, the conducting wire positioning apparatus for the conducting wire processing device further comprises a position-limiting mechanism. The position-limiting mechanism is configured to limit a displacement of the conducting wire during processes of detecting the exposed conductor portion of the conducting wire and pushing the heat-shrinkable sleeve.

In an embodiment of the second aspect, the conducting wire positioning apparatus for the conducting wire processing device further comprises a wire feeding mechanism. The wire feeding mechanism is connected to the position-limiting mechanism. The wire feeding mechanism is configured to move the position-limiting mechanism to convey the conducting wire to a preset processing position.

According to a third aspect, the present application further provides a conducting wire processing device, comprising: a main body, a heating apparatus, and the conducting wire positioning apparatus for the conducting wire processing device as described in the above. The main body is configured to support the heating apparatus and the conducting wire positioning apparatus for the conducting wire processing device. The heating apparatus is configured to heat the heat-shrinkable sleeve to enable the heat-shrinkable sleeve to be fixedly connected to the conducting wire.

In an embodiment of the third aspect, the present application further provides a conducting wire processing device further comprises a conducting wire conveying apparatus. The conducting wire conveying apparatus is arranged at the main body and configured to support and convey the conducting wire during a heating process of the conducting wire.

Advantages of embodiments of the present application are summarized as follows: by arranging the displacement assembly, the electrically conductive assembly switches between the separated position and the contact position. When the electrically conductive assembly is located at the contact position, the electrically conductive probes are in contact with the conducting wire. The distance between the two electrically conductive probes may be set to be no greater than the length of the exposed conductor portion. If the exposed conductor portion is at a designated position, the at least two electrically conductive probes can be electrically connected to the exposed conductor portion. In such condition, the detection circuit forms a conducted path via the exposed conductor portion, such that the electrical signal is output. If the exposed conductor portion is not at the designated position, then less than two electrically conductive probes are electrically connected to the exposed conductor portion, the two electrically conductive probes cannot form a conducted path, and thus the electrical signal cannot be output. Therefore, it can be determined whether the exposed conductor portion is at the designated position depending on whether the number of the electrically conductive probe in electric connection with the exposed conductor portion is at least two. The electrically conductive assembly is driven by the displacement assembly to move from the separated position to the contact position, and after the detection is completed, the electrically conductive assembly is driven by the displacement assembly to move from the contact position to the separated position, in this way, the electrically conductive probes are prevented from influencing a next processing operation. The position of the exposed conductor portion can be determined by the user by checking whether the two electrically conductive assemblies are conducted. If the two electrically conductive assemblies are conducted, the position of the conducting wire can be adjusted by the user, so that next detection is performed by the detection mechanism 100 again, until the detection circuit is conducted, which means the exposed conductor portion is located at the designated position and next processing can follow.

BRIEF DESCRIPTION OF THE DRAWINGS

In order to more clearly illustrate the technical solutions in the embodiments of the present application, the drawings that need to be used in the description of the embodiments or the prior art will be briefly described hereinbelow. Obviously, the accompanying drawings in the following description are only some embodiments of the present application. For those skilled in the art, other drawings can be obtained based on these drawings without creative work.

Figure 1:
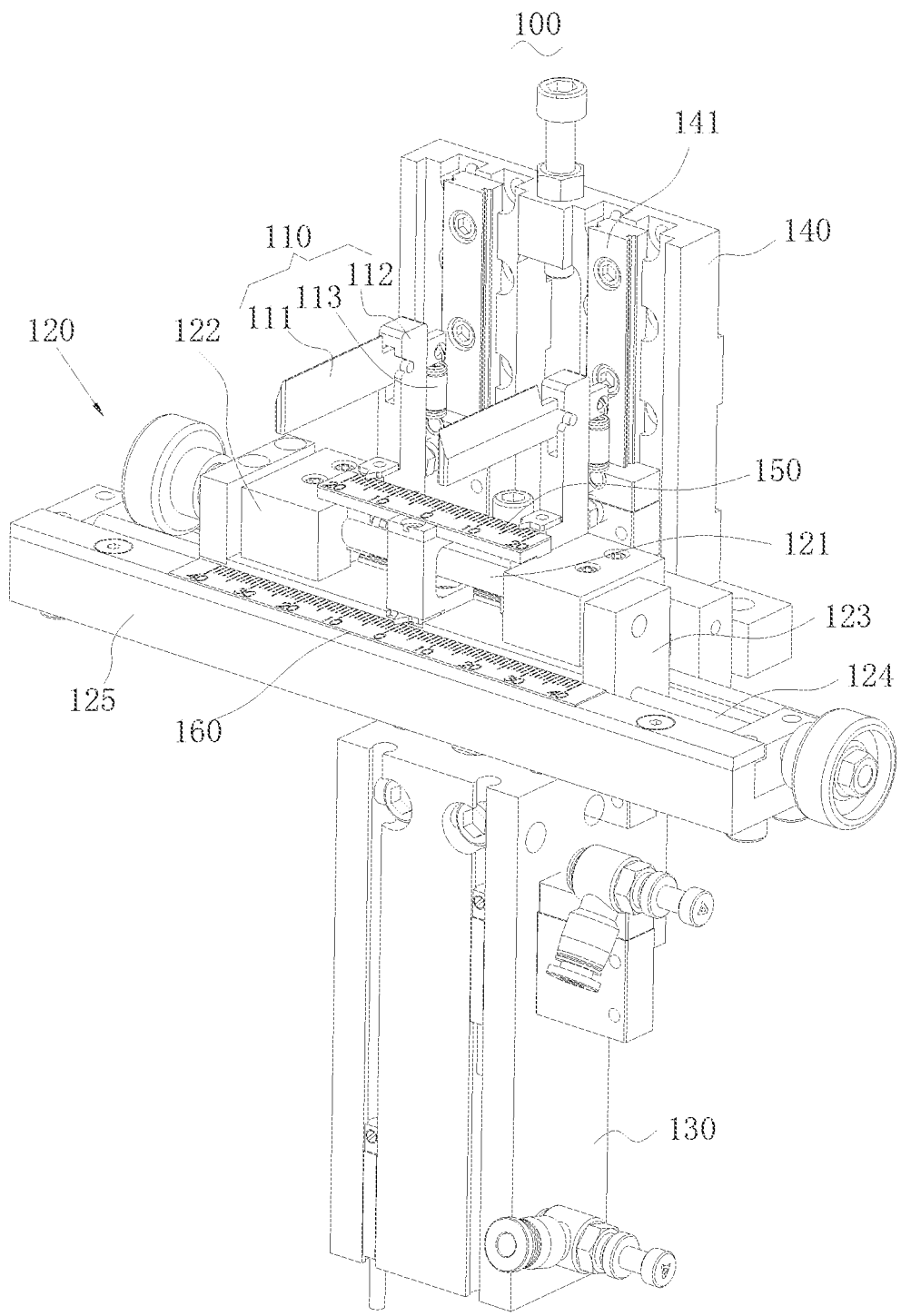
FIG. 1 is a perspective view of a detection mechanism according to an embodiment of the present application.

In the drawings, the following reference numerals are utilized:

100: detection mechanism; 110: electrically conductive assembly; 111: electrically conductive probe; 112: probe holder; 113: first elastic member; 120: regulator assembly; 121: first guide pole; 122: slide block; 123: first mounting seat; 124: second guide pole; 125: second mounting seat; 130: displacement driver; 140: fixation bracket; 141: guide rail; 150: first scale; 160: second scale; 200: position-limiting mechanism; 210: gripper; 220: movable bracket; 300: pushing mechanism; 310: driver assembly; 311: driver motor; 312: gear; 313: rack; 320: pushing assembly; 321: pressing member; 3211: pressing hand; 3212: pressing seat; 3213: third elastic member; 322: connector piece; 323: second elastic member; 400: wire feeding mechanism; 410: wire feeding motor; 420: synchronous belt; 500: frame; 510: upper plate; 520: lower plate; 530: column; 600: housing; 900: conducting wire; and 910: thermal heat-shrinkable sleeve.

DETAILED DESCRIPTION OF THE EMBODIMENTS

Embodiments of the present application are described in detail hereinbelow, and the examples of the embodiments are illustrated in the drawings, in which, the same or similar reference numerals are used to refer to the same or similar elements or elements having the same or similar functions. The embodiments described hereinbelow with reference to the accompanying drawings are intended to explain the application rather than to limit the present application.

It should be understood that terms "length", "width", "upper", "lower", "front", "rear", "left", "right", "vertical", "horizontal", "top", "bottom", "inside", "outside" and the like indicating orientation or positional relationship are based on the orientation or the positional relationship shown in the drawings, and are merely for facilitating and simplifying the description of the present application, rather than indicating or implying that a device or component must have a particular orientation, or be configured or operated in a particular orientation, and thus should not be construed as limiting the application.

Moreover, the terms "first" and "second" are adopted for descriptive purposes only and are not to be construed as indicating or implying a relative importance or implicitly indicating the number of technical features indicated. Thus, features prefixed by "first" and "second" will explicitly or implicitly represent that one or more of the referred technical features are included. In the description of the present application, the meaning of "a plurality of" or "multiple" is two or more unless otherwise specifically defined.

In the present application, unless otherwise specifically stipulated and defined, terms like "install", "connect", "couple", "fix" should be construed broadly, for example, they may indicate a fixed connection, a detachable connection, or an integral as a whole; may be a mechanical connection, or an electrical connection; may be in direct connection, or indirect connection via an intermediate, and may also reflect internal communication of two elements or interactions between two elements. For those skilled in the art, the specific meanings of the above terms in the present application can be understood according to specific conditions.

In order to make the purposes, technical solutions, and advantages of the present application clearer and more understandable, the present application will be further described in detail hereinafter with reference to the accompanying drawings and embodiments.

Figure 2:
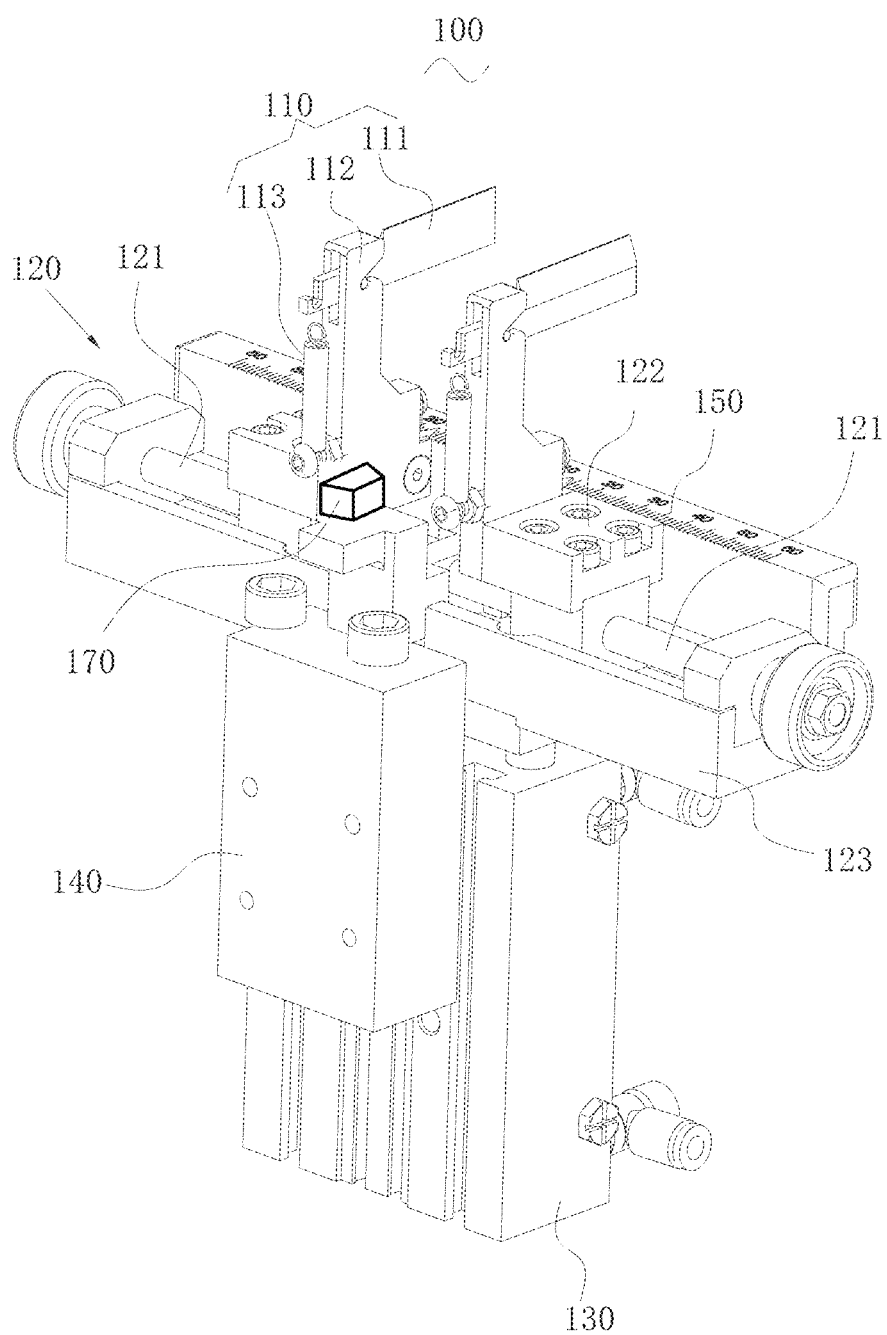
FIG. 2 is a perspective view of a detection mechanism according to another embodiment of the present application.

As shown in FIGS. 1-2, the present application provides a detection mechanism 100 for detecting an exposed conductor portion of a conducting wire 900. The exposed conductor portion is electrically conductive; while other regions of the conducting wire 900 other than the exposed conductor portion is not electrically conductive. Before the detection, the position of the conducting wire 900 has been limited.

In an embodiment, the detection mechanism 100 comprises: an electrically conductive assembly 110, a displacement assembly, a detection circuit 170, a regulator assembly 120, and a slide rail.

As shown in FIGS. 1-2, the electrically conductive assembly 110 comprises at least two electrically conductive probes 111. The at least two electrically conductive probes 111 are configured to contact with the exposed conductor portion and are electrically conductive. The at least two electrically conductive probes 111 are spacedly arranged. In an embodiment, the number of the electrically conductive probes 111 is two, a distance between the two electrically conductive probe 111 is equal to a length of the exposed conductor portion. The electrically conductive probes 111 can be in electric connection with the exposed conductor portion by contacting with the exposed conductor portion. When the two electrically conductive probes 111 are both in electric connection with the exposed conductor portion, the two electrically conductive probes 111 are conducted via the exposed conductor portion. In an embodiment, the detection circuit 170 is in electric connection with the two electrically conductive probes 111. The conduction between the two electrically conductive probes 111 via the detection circuit 170 can realize the output of the electric signal. The electrically conductive probe 111 is sheet-like and has an extension direction perpendicular to an extension direction of conducting wire 900. In other embodiments, at least two electrically conductive assemblies 110 can be provided.

The displacement assembly is configured to drive the electrically conductive assembly 110 to switch between a separated position and a contact position. The displacement assembly has a linear, zigzag, or curved moving path when driving the electrically conductive assembly 110 to switch between the separated position and the contact position. In particular, the electrically conductive assembly 110 is slidably connected with a guide rail 141 of the fixation bracket 140. The fixation bracket 140 is configured to be connected to an external structure, for example, to a frame 500. The guide rail 141 is extended along a straight line, that is, the moving path of the electrically conductive assembly 110 is a straight line. The displacement assembly is capable of driving the electrically conductive assembly 110 to slide along the guide rail 141, to achieve the switch of the electrically conductive assembly 110 between the separated position and the contact position. In an embodiment, the electrically conductive assembly 110 can be in slide connection with the guide rail 141 via other parts. The displacement assembly and the electrically conductive assembly 110 can be independently arranged. In this embodiment, the displacement assembly is in connection with the electrically conductive assembly 110, and particularly in connection with the probe holder.

In an embodiment, the moving path of the electrically conductive assembly 110 between the separated position and the contact position is a straight line, that is, the electrically conductive assembly 110 is driven by the displacement assembly to reciprocate along the straight line between the separated position and the contact position. When the electrically conductive assembly 110 is at the contact position, the electrically conductive probes 111 are in contact with the conducting wire 900. In such condition, if the electrically conductive probes 111 are in contact with the exposed conductor portion, the electrically conductive probes 111 are in electric connection with the exposed conductor portion. If the electrically conductive probes 111 are in contact with other portions of the conducting wire 900 other than the exposed conductor portion, the electrically conductive probes 111 is not in electric connection with the exposed conductor portion. When the electrically conductive assembly 110 is at a separated position, the electrically conductive probes 111 are separated from the conducting wire 900. In such condition, both the electrically conductive probes 111 are not in electric connection with the exposed conductor portion. Preferably, the moving path of the electrically conductive assembly 110 is perpendicular to the extension direction of the conducting wire 900, so as to achieve rapid contact and separation between the electrically conductive assembly 110 and the conducting wire 900. The displacement assembly comprises a displacement driver 130. The displacement driver 130 is configured to drive the electrically conductive assembly 110 and the regulator assembly 120 to move along a straight line, and enable the electrically conductive assembly 110 to switch between the separated position and the contact position. The displacement driver 130 may be a cylinder, and the regulator assembly 120 is connected to a piston rod of the cylinder. A piston of the cylinder can push the piston rod to move in a straight line, so that the regulator assembly 120 drives the electrically conductive assembly 110 to move in a straight line, and the electrically conductive assembly 110 can switch between the separated position and the contact position.

When the electrically conductive assembly 110 is at the contact position, it is determined by the detection circuit whether the exposed conductor portion of the conducting wire 900 is at a designated position. When the at least two electrically conductive probes 111 are all in electric connection with the exposed conductor portion of the conducting wire 900, it is determined that the exposed conductor portion is at the designated position. When the number of electrically conductive probes 111 in electric connection with the exposed conductor portion of the conducting wire 900 is less than two, it is determined that the exposed conductor portion is not located at the designated location. In particular, when at least two of the electrically conductive probes 111 are in contact with the tested conductor, the detection circuit is conducted, and it is determined that the exposed conductor portion is at a designated position. When the number of the electrically conductive probes 111 in contact with the tested conductor is less than two, the detection circuit is disconnected, and it is determined that the exposed conductor portion is not at the designated position.

That is, when the electrically conductive assembly 110 is located at the contact position, at least two electrically conductive probes 111 are in contact with the conducting wire 900. If the exposed conductor portion is at a designated position, the at least two electrically conductive probes 111 can be electrically connected to the exposed conductor portion. In such condition, the at least two electrically conductive probes 111 form a conducted path via the exposed conductor portion, and the detection circuit is turned on, whereby the electrical signal is output. If the exposed conductor portion is not at the designated position, then less than two electrically conductive probes 111 are electrically connected to the exposed conductor portion, the two electrically conductive probes 111 cannot form a conducted path, and the detection circuit is disconnected, whereby the electrical signal cannot be output. Therefore, it can be determined whether the exposed conductor portion is at the designated position depending on whether the number of the electrically conductive probe 111 in electric connection with the exposed conductor portion is at least two. When the detection mechanism is used for detection, the electrically conductive assembly 110 is firstly driven by the displacement assembly to move from the separated position to the contact position, and the detection is performed by the detection circuit. After the detection is completed, the electrically conductive assembly 110 is driven by the displacement assembly to move from the contact position to the separated position. The position of the exposed conductor portion can be determined by the user by checking whether the detection circuit was conducted. If the detection circuit was not turned on, the position of the conducting wire 900 can be adjusted by the user, so that next detection is performed by the detection mechanism 100 again, until the detection circuit is conducted, which means the exposed conductor portion is located at the designated position and next processing can follow.

Whether the detection circuit is turned on can be prompted by a lamp or a sound prompting device, for example, a light or sound alarm can be provided in the detection circuit. If the detection circuit is turned on, the lamp will glow or the sound alarm will generate a sound to remind the operator that the detection circuit is turned on. In addition, an electrical signal generated after the detection circuit is turned on can be used as the condition for the next processing. Specifically, if the detection circuit is turned on, the electrical signal is output, and accordingly, a next processing device is controlled by a host computer to continue the processing; and if the detection circuit is not turned on, then no electrical signal is output, and the next processing device is controlled by the host computer to not work.

By adjusting the position of the conducting wire 900 by the user, the position of the exposed conductor portion can be adjusted until to a position where at least two electrically conductive probes 111 are electrically connected, in such condition, it can be determined that the exposed conductor portion is located at the designated position, so that the determination of the position of the conducting wire 900 is achieved by the user by adopting the detection mechanism 100.

By the detection mechanism 100 according to this embodiment, the electrically conductive assembly 110 is driven by the displacement assembly to move from the separated position to the contact position, and after the detection, the electrically conductive assembly is driven by the displacement assembly to move from the contact position to the separated position, in this way, the electrically conductive probe 111 is prevented from affecting the operation of the next processing.

In an embodiment, the electrically conductive probe 111 elastically abuts the conducting wire 900 when the electrically conductive assembly 110 is located at the contact position. In this way, the electrically conductive probe 111 can always be in close contact with the conducting wire 900, it is prevented the problem that the electrically conductive probe 111 may be separated from the conducting wire 900 after a long time of use, and the poor contact may be resulted.

As shown in FIGS. 1-2, the electrically conductive assembly 110 further comprises a probe holder 112, and the electrically conductive probe 111 is rotatably connected with the probe holder 112. The probe holder 112 can be driven by the displacement assembly to move to enable the electrically conductive probe 111 to move toward or away from the conducting wire 900, and the probe holder 112 functions in supporting the electrically conductive probe 111. Two electrically conductive probes 111 can be connected with respective probe holders 112, and the distance between the two the probe holders 112 is not adjustable in such condition. In another embodiment, two electrically conductive probes 111 are provided, with the two electrically conductive probes 111 being respectively connected to probe holders 112. The two probe holders 112 are capable of driving the respective electrically conductive probes 111 to move, so as to adjust the distance between the electrically conductive probes 111.

The electrically conductive probes 111 may be fixedly connected to the probe holders 112, respectively. The electrically conductive probes 111 may have elasticity by itself, or the probe holders 112 may have elasticity, so that when the electrically conductive assembly 110 is located at the contact position, the electrically conductive probes 111 or the probe holders 112 are elastically deformed, and the electrically conductive probes 111 can apply an elastic force to the conducting wire 900. In such condition, the electrically conductive probes 111 or the probe holders 112 may be metal shrapnels.

As shown in FIGS. 1-2, in an embodiment, the electrically conductive probes 111 are in rotatable connection with the probe holders 112, respectively. The extension direction of each probe holder 112 is perpendicular to the extension direction of the conducting wire 900, and the rotation axis of each electrically conductive probe 111 is parallel to the extension direction of the conducting wire 900. The electrically conductive assembly 110 further comprises first elastic members 113 connected to the electrically conductive probes 111, respectively, and the first elastic members 113 are configured to be elastically deformed when the electrically conductive assembly 110 is located at the contact position and to provide elastic forces to reset the electrically conductive probes 111. Middle potions of the electrically conductive probes 111 are rotatably connected to the probe holders 112. One end of each electrically conductive probe 111 is configured to abut against the conducting wire, and the other end of each electrically conductive probe 111 is connected to the corresponding first elastic member 113. One end of each first elastic member 113 is connected to the corresponding electrically conductive probe 111, and the other end of each first elastic member 113 is connected to the corresponding probe holder 112. When the electrically conductive assembly 110 is located at the contact position, tensile deformation of the first elastic members 113 occurs, and when the electrically conductive assembly 110 leaves the contact position, the electrically conductive probes 111 are reset under the elastic force of the first elastic members 113. The first elastic member 113 may be a spring.

Normally, when the heat-shrinkable sleeve 910 is located at a preset position, a midpoint of the exposed conductor portion coincides with a midpoint of the heat-shrinkable sleeve 910. However, in case that the conducting wire 900 has a different thickness or different number of wires on two sides of the exposed conductor portion, if the midpoint of the exposed conductor portion is still kept coincident with the midpoint of the heat-shrinkable sleeve 910 at the preset position, the heat-shrinkable sleeve 910 may shrink toward one side after heat shrinking, which eventually results in incomplete covering of the heat-shrinkable sleeve 910. Therefore, the preset position needs to be offset to a designated position, that is, the exposed conductor portion needs to be deviated from an original designated position to enable the heat-shrinkable sleeve 910 to cover the exposed conductor portion after heat shrinking. In this regard, the detection mechanism 100 further comprises a regulator assembly 120. The regulator assembly 120 is configured to adjust the position of the electrically conductive assembly 110 in the extension direction of the conducting wire 900. The above position includes: a distance between adjacent two electrically conductive assemblies 110, and a position of the electrically conductive assemblies 110 as a whole. The displacement assembly can drive the regulator assembly 120 to move to drive the electrically conductive assembly 110 to move between the separated position and the contact position. In this way, it is realized that the electrically conductive assemblies 110 as a whole can maintain the current relative position for displacement.

As shown in FIGS. 1-2, specifically, the regulator assembly 120 further comprises: a first mounting seat 123, at least one first guide pole 121 and at least one slide block 122. The first guide pole 121 is arranged in a rotatable manner. The at least one slide block 122 is movably connected to the at least one first guide pole 121 and can move along the extension direction of the at least one first guide pole 121. The first mounting seat 123 is slidably connected to the guide rail 141. In an embodiment, the first mounting seat 123 can be in directly slidable connection with the guide rail 141. In another embodiment, the first mounting seat 123 is in slidable connection with the guide rail 141 via other structures. The above-mentioned movable connection includes: slidable connection, movable socket connection, and threaded connection. In an embodiment, the at least one slide block 122 is in threaded connection with the at least one first guide pole 121. An extension direction of the at least one first guide pole 121 is the same as the extension direction of the conducting wire 900, and the electrically conductive assembly 110 is in connection with a respective slide block 122. When the first guide pole 121 rotates, the slide blocks 122 do not rotate, so that the first guide pole 121 realizes the reciprocating movement of the slide blocks 122 along the extension direction of the first guide pole 121 through forward or reverse rotation. In other words, when the slide blocks 122 move along the first guide pole 121, the electrically conductive probes 111 move along the extension direction of the conducting wire 900. When the two slide blocks 122 move towards or away from each other, the distance between the two electrically conductive probes 111 is adjusted; and when the two slide blocks 122 move towards the same direction, the two electrically conductive probes 111 moves as a whole by keeping the current distance therebetween. In order to facilitate the user's operation, a hand-held knob is provided at one end of the first guide pole 121.

As shown in FIG. 1, in an embodiment, the number of the at least one first guide pole 121 is one, and the number of the slide blocks 122 is two. The first guide pole 121 has a first threaded section and a second threaded section, a threaded direction of the first threaded section is opposite to a threaded direction of the second thread section, and the two slide blocks 122 are respectively in threaded connection with the first thread section and the second thread section. In this way, when the first guide pole 121 rotates, since the slide blocks 122 do not rotate, the slide block 122 in threaded connection with the first threaded section and the slide block 122 in threaded connection with the second threaded section are linked together and have opposite moving directions, for example, the two slide blocks 122 synchronously move towards each other during the rotation of the first guide pole 121 in a forward direction, while the two slide blocks 122 synchronously move away from each other during the rotation of the first guide pole 121 in a backward direction, in this way, the distance between the two slide blocks 122 is quickly adjusted, and the distance between the two electrically conductive probes 111 is quickly adjusted. In the meanwhile, the midpoint between the two electrically conductive probes 111 is constant, that is, the designated position is constant. The first guide pole 121 can be screwed by the user to adjust the distance between the two slide blocks 122, in order to adapt to the length of the exposed conductor portion. In an embodiment, the displacement assembly drives the first mounting seat 123 to move, thereby driving the electrically conductive assembly 110 to switch between the separated position and the contact position.

In order to facilitate viewing the moving distance of the electrically conductive probes 111 or the distance between the two electrically conductive probes 111, the detection mechanism 100 further includes a first scale 150 in connection with the first mounting seat 123, and the first scale 150 is configured to indicate a position of the electrically conductive probe 111. The extension direction of the first scale 150 is the same as an extension direction of the first guide pole. The electrically conductive assemblies 110 can always correspond to scale marks on the first scale 150 during the movement, and the subtraction of scale marks pointed by the two electrically conductive assemblies 110 is the distance between the two electrically conductive assemblies 110.

As shown in FIG. 1, when the electrically conductive assemblies 110 need to be biased, in order to quickly realize the overall bias of the electrically conductive assemblies 110, the regulator assembly 120 further comprises: a second guide pole 124, a first mounting seat 123, and a second mounting seat 125. The first mounting seat 123 is movably connected to the second guide pole 124, the second mounting seat 125 is in directly slidable connection with the guide rail 141, the first mounting seat 123 is connected to the guide rail 141 via the second mounting seat 125, and the second guide pole 124 is connected to the second mounting seat 125. The first mounting seat 123 is capable of moving in the extension direction of the second guide pole 124. The displacement assembly can drive the second mounting seat 125 to slide along the extension direction of the guide rail 141 to move closer to or away from the conducting wire 900, so that the electrically conductive assembly 110 can be switched between the separated position and the contact position. The above-mentioned movable connection may be slidable connection, movable socket connection, or threaded connection. In an embodiment, the second guide pole 124 is in threaded connection with the first mounting seat 123, and the second guide pole 124 is capable of driving the first mounting seat 123 to move along the extension direction of the second guide pole 124 by rotating around an axis of the second guide pole 124. When the second guide pole 124 rotates, the first mounting seat 123 does not rotate. By rotating the second guide pole 124 forward or backward, the reciprocate movement of the first mounting seat 123 along the extension direction of the second mounting seat 125 is achieved. In use, the distance between the two slide blocks 122 is adjusted by the user by screwing the first guide pole 121, and then the position of the first mounting seat 123 is adjusted by screwing the second guide pole 124, so that the two electrically conductive probes 111 are biased as a whole while keeping the distance between the two electrically conductive probes 111 unchanged.

As shown in FIG. 1, in order to check the offset distance of the first mounting seat 123, the detection mechanism 100 further includes a second scale 160 connected to the second mounting seat 125, and the second scale 160 is configured to indicate the position of the first mounting seat 123. The extension direction of the second scale 160 is the same as the extension direction of the guide rod, the first mounting seat 123 can correspond to a scale mark on the second scale 160 during the movement, a difference between the corresponding scale mark of the first mounting seat 123 after adjustment and the corresponding scale mark of the first mounting seat 123 before adjustment can be read by the user, to obtain the overall offset of the electrically conductive probe 111.

As shown in FIG. 2, in another embodiment, two first guide poles 121 are provided, the two first guide poles 121 are located in a same straight line, and the slide blocks 122 are in threaded connection with the first guide poles 121, respectively. In this way, the two first guide poles 121 respectively drive the corresponding slide blocks 122 to move, which realizes the separate adjustment of the positions of the two slide blocks 122. Not only is the adjustment of the distance between the two slide blocks 122 realized, but also the overall offset of the two slide blocks is realized, which means the midpoint position between the two slide blocks 122 changes, that is, the midpoint position between the two electrically conductive probes 111 changes, and the designated position changes immediately to complete the offset of electrically conductive assembly 110. The regulator assembly 120 in this embodiment can simultaneously adjust the distance between the two electrically conductive assemblies 110 and adjust the overall position of the electrically conductive assembly 110, and the second mounting seat 125 and the second guide pole 124 may not be provided.

However, it is cumbersome to adjust the two first guide poles 121 separately when biasing the electrically conductive assemblies 110. The two first guide poles 121 are required to be screwed separately by the user to make the electrically conductive assemblies 110 move the same distance. Therefore, in order to achieve rapid biasing of the electrically conductive assemblies 110, the second guide pole 124 and the second mounting seat 125 may also be provided. The first mounting seat 123 is movably connected to the second guide pole 124, the second mounting seat 125 is in directly slidable connection with the guide rail 141, the first mounting seat 123 is connected to the guide rail 141 via the second mounting seat 125, and the second guide pole 124 is connected to the second mounting seat 125. The first mounting seat 123 is capable of moving in the extension direction of the second guide pole 124. The displacement assembly can drive the second mounting seat 125 to slide along the extension direction of the guide rail 141, so that the electrically conductive assembly 110 can be switched between the separated position and the contact position. The above-mentioned movable connection may be slidable connection, movable socket connection, or threaded connection. In an embodiment, the second guide pole 124 is in threaded connection with the first mounting seat 123, and the second guide pole 124 is capable of driving the first mounting seat 123 to move along the extension direction of the second guide pole 124 by rotating around the axis of the second guide pole 124. When the second guide pole 124 rotates, the first mounting seat 123 does not rotate. By rotating the second guide pole 124 forward or backward, the reciprocate movement of the first mounting seat 123 along the extension direction of the second mounting seat 125 is achieved. In use, the distance between the two slide blocks 122 is adjusted by the user by screwing the first guide pole 121, and then the position of the first mounting seat 123 is adjusted by screwing the second guide pole 124, so that the two electrically conductive probes 111 are biased as a whole while keeping the distance between the two electrically conductive probes 111 unchanged.

As shown in FIG. 2, in the above embodiment, the first mounting seat 123 is provide with the first scale 150, configured to indicate the position of the electrically conductive probe 111. The extension direction of the first scale 150 is the same as an extension direction of the first guide pole. The electrically conductive assemblies 110 can always correspond to scale marks on the first scale 150 during the movement, and the subtraction of scale marks pointed by the two electrically conductive assemblies 110 is the distance between the two electrically conductive assemblies 110. And a half of the sum of the scale marks pointed by the two electrically conductive assemblies 110 is the midpoint position of the two electrically conductive assemblies 110, thus, the offset distance of the current preset position from the previous preset position. In the meanwhile, the extension direction of the second scale 160 is the same as the extension direction of the guide rod, the first mounting seat 123 can correspond to a scale mark on the second scale 160 during the movement, a difference between the corresponding scale mark of the first mounting seat 123 after adjustment and the corresponding scale mark of the first mounting seat 123 before adjustment can be read by the user, to obtain the overall offset of the electrically conductive probe 111.

Figure 3:
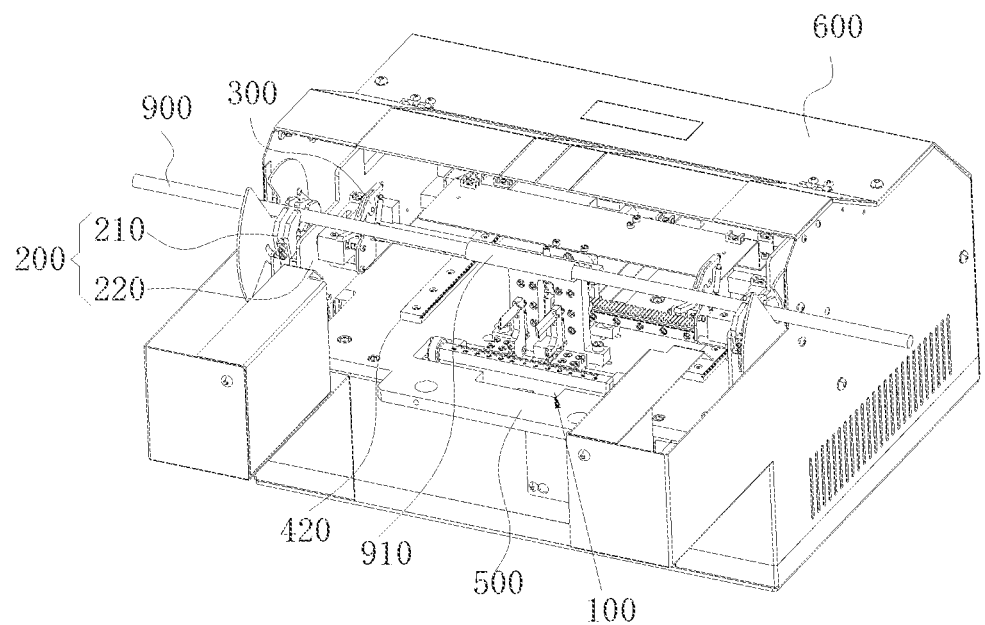
FIG. 3 is a perspective view of a conducting wire processing device for a conducting wire positioning apparatus according to an embodiment of the present application.

As shown in FIG. 3, the present invention also provides a conducting wire positioning apparatus for a conducting wire processing device. The conducting wire positioning apparatus includes: a housing 600, a frame 500, a position-limiting mechanism 200, a pushing mechanism 300, and a wire feeding mechanism 400, and the detection mechanism 100 mentioned in the above embodiments. The detection mechanism 100 has the same structure and the same function as the detection mechanism 100 in the above-described embodiments, and will not be repeated here.

Figure 6:
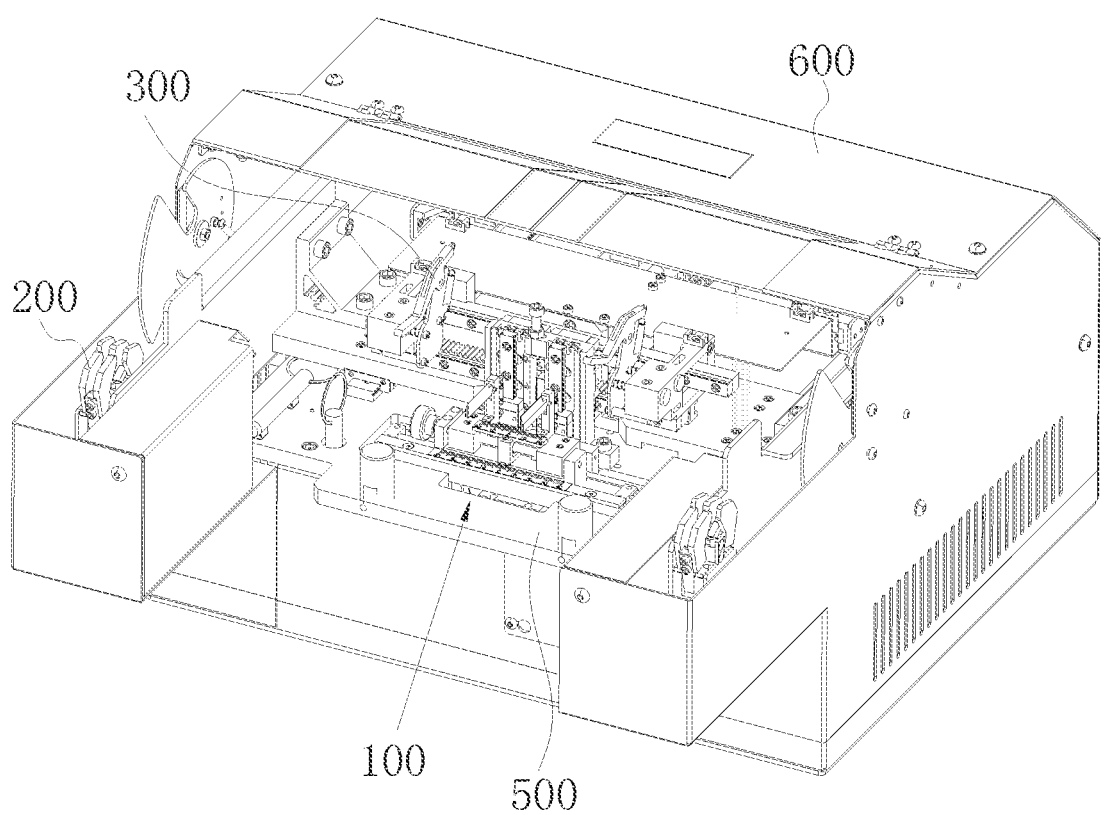
FIG. 6 is a perspective view of a conducting wire processing device for a conducting wire positioning apparatus according to another embodiment of the present application.

As shown in FIGS. 3 and 6, the frame 500, the position-limiting mechanism 200, the pushing mechanism 300, the wire feeding mechanism 400, and the detection mechanism 100 are all arranged within the housing 600. The detection mechanism 100, the pushing mechanism 300, and the wire feeding mechanism 400 are all fixedly connected to the frame 500. A fixation bracket 140 of the detection mechanism 100 is connected to the frame 500, the position-limiting mechanism 200 is slidably connected to the frame 500, and the wire feeding mechanism 400 is connected to the position-limiting mechanism 200.

Figure 4:
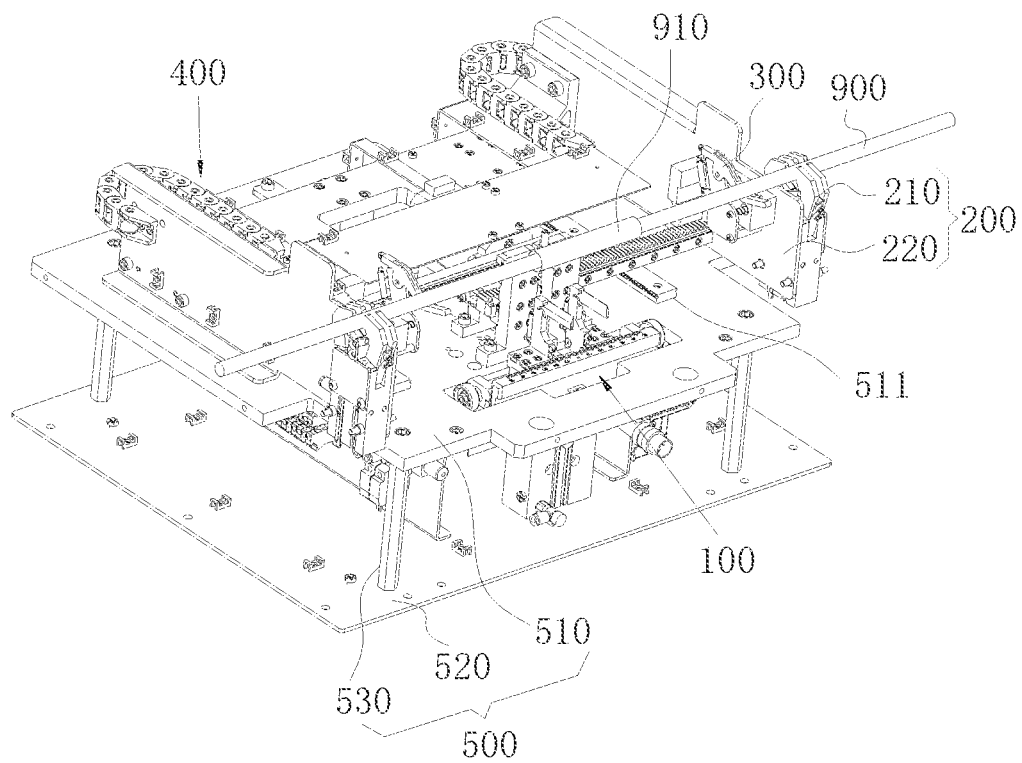
FIG. 4 is a partial enlarged view of the conducting wire processing device for a conducting wire positioning apparatus of FIG. 3, with the housing not shown.
Figure 5:
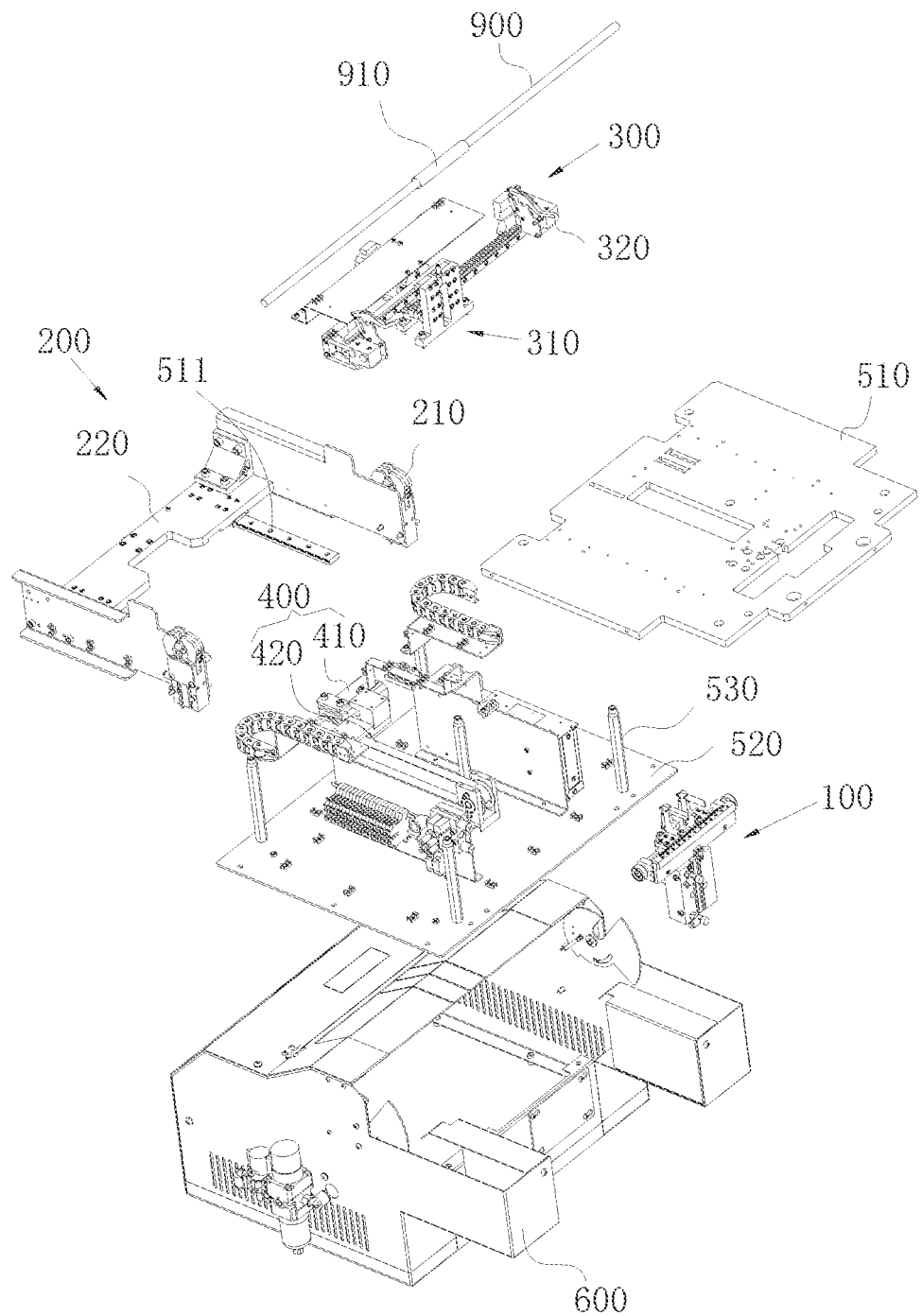
FIG. 5 is an exploded view of the conducting wire processing device for a conducting wire positioning apparatus of FIG. 3.

As shown in FIGS. 4-5, the position-limiting mechanism 200 is configured to limit a displacement of the conducting wire 900 during processes of detecting the exposed conductor portion of the conducting wire 900 and pushing the heat-shrinkable sleeve 910. In an embodiment, the position-limiting mechanism 200 is grippers 210, which can limit the position of the conducting wire 900 by clamping the conducting wire 900. The position-limiting mechanism 200 may include movable brackets 220 and two grippers 210 respectively in connection with the movable bracket 220, in order to fix the position of the conducting wire 900. The conducting wire 900 is in a tension state when being fixed, and the exposed conductor portion is located between the two the grippers 210.

The pushing mechanism 300 is configured to push the heat-shrinkable sleeve 910 sleeving around the conducting wire 900 to a preset position. The heat-shrinkable sleeve 910 can be the heat-shrinkable sleeve 910. The heat-shrinkable sleeve 910 has an inner diameter greater than an outer diameter of the conducting wire 900 thereby being capable of sliding along the conducting wire 900, and has a length no less than a length of the exposed conductor portion. The preset position can be a designated position or can be deviated from the designated position. The heat-shrinkable sleeve 910 at the preset position can cover the designated position of the exposed conductor portion after heat shrinking. The pushing mechanism 300 can abut against the conducting wire 900 when the position-limiting mechanism 200 clamps the conducting wire 900.

As shown in FIGS. 4-5, the pushing mechanism 300 includes a driver assembly 310 and a pushing assembly 320. The driver assembly 310 is connected to the pushing assembly 320 and configured to drive the pushing assembly 320 to move towards or away from the preset position, so that the heat-shrinkable sleeve 910 moves to the preset position.

One pushing assembly 320 may be provided, and the pushing assembly 320 moves from one side of the heat-shrinkable sleeve 910 to the other side along the extension direction of the conducting wire 900.

Figure 7:
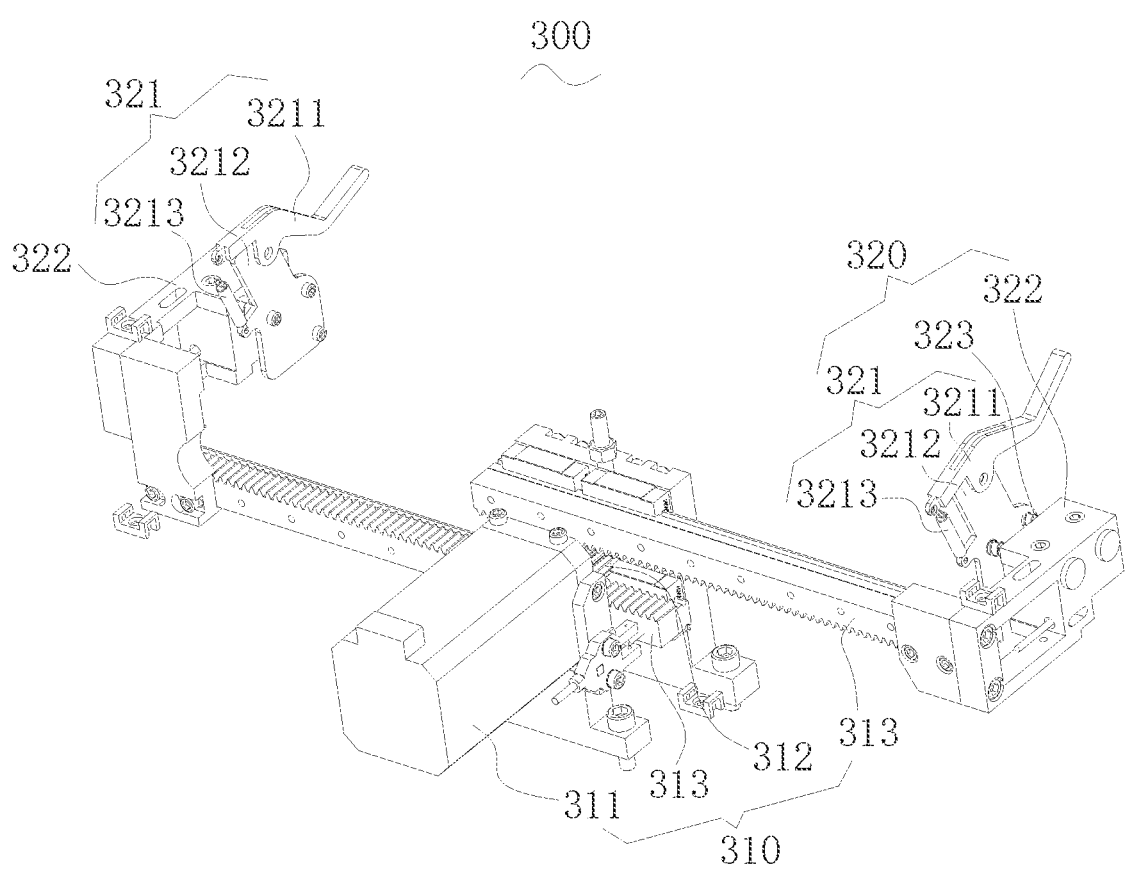
FIG. 7 is a perspective view of a pushing mechanism of a conducting wire processing device for a conducting wire positioning apparatus in FIGS. 3 and 5.

As shown in FIG. 7, preferably, two pushing assemblies 320 are provide, the two pushing assemblies 320 can move toward or away from each other. When the two pushing assemblies 320 move toward each other, the heat-shrinkable sleeve 910 can be eventually clamped by the two pushing assemblies 320 and moved to the preset position. When the two pushing assemblies 320 are in contact with the heat-shrinkable sleeve 910, a distance between the two pushing assemblies 320 is equal to or slightly smaller than the length of the heat-shrinkable sleeve 910. When the two pushing assemblies 320 move away from each other, the two pushing assemblies 320 are separated from the heat-shrinkable sleeve 910. The driver assembly 310 includes: a driver motor 311, a gear 312 connected to the driver motor 311, and two racks 313 engaged with the gear 312. The pushing assemblies 320 are connected to the racks 313, respectively, and the two racks 313 are arranged facing away from each other in a parallel manner. When the driver motor 311 drives the gear 312 to rotate, the two racks 313 move in opposite directions synchronously, realizing the linkage of the two pushing assemblies 320.

As shown in FIG. 7, each pushing assembly 320 includes: a connector piece 322, a pressing member 321, a second elastic member 323, and a sensor. The connector piece 322 can move toward or away from the preset position driven by the driver assembly 310. The second elastic member 323 is connected to the pressing member 321. Specifically, the second elastic member 323 is located between the pressing member 321 and the connector piece 322. The driver assembly 310 can drive the connector piece 322 to move toward or away from the preset position. The pressing member 321 is slidably connected to the connector piece 322 and is located at a side of the connector piece 322 facing the preset position. The second elastic member 323 is configured to apply an elastic force to the pressing member 321 to enable the pressing member 321 to move away from the connector piece 322. When both the pushing assemblies 320 press the heat-shrinkable sleeve 910, and the two pressing members 321 press the heat-shrinkable sleeve 910, in which condition, each pressing member 321 is subjected to the pressure from the other pressing member 321, and the second elastic members 323 are compressed, so that the second elastic members 323 will cushion the pushing of the heat-shrinkable sleeve 910, thus preventing the heat-shrinkable sleeve 910 from being deformed when clamped by the pushing mechanism 300. The pressing members 321 elastically press the conducting wire 900 to ensure that the pressing members 321 can be moved to the heat-shrinkable sleeve 910. Each pressing member 321 may include: a pressing hand 3211, a pressing seat 3212, and a third elastic member 3213. The pressing seat 3212 is slidably connected to the connector piece 322, the pressing hand 3211 is rotatably connected to the pressing seat 3212, and the third elastic member 3213 is connected to the pressing hand 3211 and the pressing seat 3212. When the pressing member 321 presses the conducting wire 900, the pressing hand 3211 presses the conducting wire 900, and the third elastic member 3213 is elastically deformed to apply a reset elastic force to the pressing hand 3211. The sensor is connected to the connector piece 322, the pressing member 321 is capable of contacting with the sensor when pressing the heat-shrinkable sleeve 910 and compressing the second elastic member 323 to a certain distance, in such case, the sensor sends a control signal to stop the driver assembly 310 from pushing the pressing member. The contacting of the pressing member 321 with the sensor may be the contacting of the pressing hand 3211 with the sensor, or the contacting of the pressing seat 3212 with the sensor. In an embodiment, the pressing seat 3212 is provided with a pressing rod extended facing the sensor, and when the pressing rod contacts with the sensor, the sensor sends out the control signal.

As shown in FIG. 5, the wire feeding mechanism 400 is configured to move the position-limiting mechanism 200 relative to the frame 500, and transfer the conducting wire 900 to a predetermined processing position. Specifically, the wire feeding mechanism 400 is connected to the movable bracket 220, and configured to drive the movable bracket 220 to move to enable the position-limiting mechanism 200 to move towards a heat shrink machine. The position-limiting mechanism 200 is configured to release the conducting wire 900, when the conducting wire 900 is located above a crawler, so as to place the conducting wire 900 on the crawler. The predetermined processing position is located on the crawler, that is, the wire feeding mechanism 400 is able to place the conducting wire 900 on the crawler by driving the position-limiting mechanism 200 to move, and is able to convey the conducting wire into the heat device of the heat shrinking machine for heat shrinkage. The frame 500 is provided with a moving crawler, and the position-limiting mechanism 200 is slidably connected to the moving crawler. The wire feeding mechanism 400 includes a wire feeding motor 410 and a synchronous belt 420 connected to the wire feeding motor 410. The movable bracket 220 is connected to the synchronous belt 420, and the wire feeding motor 410 is able to drive the synchronous belt 420 to move, thereby driving the movable bracket 220 to move.

As shown in FIG. 5, the frame 500 includes: an upper plate 510, a lower plate 520, and columns 530 in connection with the upper plate 510 and the lower plate 520. The upper plate 510 and the lower plate 520 are arranged in parallel and spaced apart. The wire feeding motor 410, the displacement assembly, and other components can be connected to the upper plate 510 and placed between the upper plate 510 and the lower plate 520. The columns 530 are able to support the upper plate 510 and the lower plate 520, and the upper plate 510 and the lower plate 520 are able to protect the components arranged therebetween.

In use, the conducting wire 900 are arranged within the two grippers by the user, to enable the two grippers to hold the conducting wire 900, in this case, the pressing members 321 elastically resists the conducting wire 900, and the detection mechanism 100 is configured to detect the position of the conducting wire 900. When the exposed conductor portion is detected to be at the designated position, the driver assembly 310 drives the two pushing assemblies 320 to move toward each other, until both the two pressing hands 3211 press the heat-shrinkable sleeve 910. When the pressing members 321 contact with the sensor, the driver assembly 310 stops driving. In such condition, the heat-shrinkable sleeve 910 is located at the preset position, and then the driver assembly 310 drives the pushing assemblies 320 to move away from each other from the initial position, during which, the wire feeding motor 410 drives the synchronous belt 420 to move, and the synchronous belt 420 in turn drives the movable bracket 220 to move until the conducting wire 900 is fed into the heat shrinking machine. The gripper 210 is separated from the conducting wire 900, and the wire feeding motor 410 drives the synchronous belt 420 to move in the reverse direction until the movable bracket 220 is reset for a next round of operation.

The present application further provides a conducting wire processing device, which includes: a main body, a heating apparatus, a conducting wire conveying apparatus, and the conducting wire positioning apparatus for the conducting wire processing device as described in the above embodiments. The conducting wire positioning apparatus used for the conducting wire processing device has the same structure and functions as the conducting wire positioning apparatus used for the conducting wire processing device in the above embodiments, which will not be repeated here.

The main body is used to support the heating apparatus and the conducting wire positioning apparatus for the conducting wire processing device. The conducting wire conveying apparatus is arranged at the main body, and is configured to support and convey the conducting wire 900 during the heating process of the conducting wire 900. In an embodiment, the conducting wire conveying apparatus is a crawler, the conducting wire conveying apparatus is able to convey the conducting wire 900 and transfer the conducting wire 900 within the heating apparatus. In use, the conducting wire positioning apparatus is configured to fix the heat-shrinkable sleeve 910, and then configured to place the conducting wire on the conducting wire conveying apparatus after the heat-shrinkable sleeve 910 is pushed to the preset position. The heating apparatus by the conducting wire conveying apparatus then conveys the conducting wire 900 within the heating apparatus, where the heat-shrinkable sleeve 910 is heated, such that the heat-shrinkable sleeve 910 is shrunk and fixedly connected to the conducting wire 900. In such condition, the heat-shrinkable sleeve 910 covers the exposed conductor portion, thereby completing the processing of the conducting wire 900.

The above are only preferred embodiments of the present application, and only specifically describe the technical principles of the present application. These descriptions are only for explaining the principles of the present application and cannot be construed as limiting the protection scope of the present application in any way. Based on this explanation, any modifications, equivalent substitutions, and improvements made within the spirit and principle of the present application, and other specific implementations of the present application to which those skilled in the art may associate, without creative work, should be included in the protection scope of the present application.

What is claimed is:

1. A detection mechanism for detecting an exposed conductor portion of a conducting wire, the detection mechanism comprising:
    an electrically conductive assembly, comprising at least two electrically conductive probes; wherein, the at least two electrically conductive probes are spacedly arranged and are configured to be in electric connection with the exposed conductor portion by contacting with the exposed conductor portion;
    a displacement driver, configured to drive the electrically conductive assembly to physically move between a separated position and a contact position; wherein a moving path of the electrically conductive assembly is a straight line; when the electrically conductive assembly is located at the contact position, the at least two electrically conductive probes are in physical contact with the conducting wire; when the electrically conductive assembly is at a separated position, the at least two electrically conductive probes are physically separated from the conducting wire; and
    a detection circuit being in electric connection with the at least two electrically conductive probes; and
    a regulator assembly having at least one first guide pole and at least one slide block,
    the at least one first guide pole is arranged in a rotatable manner, an extension direction of the at least one first guide pole is the same as an extension direction of a longitudinal axis of the conducting wire,
    the electrically conductive assembly is connected to the at least one slide block;
    wherein the regulator assembly further comprises a second guide pole and a first mounting seat;
    the at least one first guide pole is in connection with the first mounting seat;
    the first mounting seat is in movable connection with the second guide pole; and
    the first mounting seat is configured to move along an extension direction of the second guide pole;
    wherein when the electrically conductive assembly is located at the contact position, the detection circuit is configured to detect and determine whether the exposed conductor portion of the conducting wire is properly positioned in the detection mechanism;
    wherein, when the at least two electrically conductive probes are all in electric engagement with the exposed conductor portion of the conducting wire, the detection circuit is turned on, and it is determined that the exposed conductor portion properly positioned in the detection mechanism; and
    wherein, when less than two electrically conductive probes are in electric engagement with the exposed conductor portion of the conducting wire, it is determined that the exposed conductor portion is not properly positioned in the detection mechanism; and
    wherein the regulator assembly is configured to adjust positions of the electrically conductive probes in a direction of the longitudinal axis of the conducting wire.

2. The detection mechanism according to claim 1, wherein the moving path of the electrically conductive assembly between the separated position and wherein the contact position is perpendicular to the longitudinal axis of the conducting wire.

3. The detection mechanism according to claim 1, wherein
    the number of the at least one first guide pole is one;
    the number of the at least one slide block is two; and
    the first guide pole has a first threaded section and a second threaded section, a thread direction of the first threaded section is opposite to a thread direction of the second threaded section, and the two slide blocks are respectively in threaded connection with the first threaded section and the second threaded section.

4. The detection mechanism according to claim 1, wherein
    the number of the at least one first guide pole is two;
    the number of the at least one slide block is two; and
    the two slide blocks are respectively in threaded connection with the two first guide poles.

5. The detection mechanism according to claim 1, wherein the second guide pole is in threaded connection with the first mounting seat and wherein the second guide pole is configured to drive the first mounting seat to move along the extension direction of the second guide pole by rotating around an axis of the second guide pole.

6. The detection mechanism according to claim 1, wherein
    the regulator assembly further comprises a second mounting seat;
    the second guide pole is in connection with the second mounting seat; and
    the displacement driver is configured to drive the second mounting seat to move away from or close to the conducting wire, such that the electrically conductive assembly switches between the separated position and the contact position.

7. The detection mechanism according to claim 1, wherein
the electrically conductive assembly further comprises probe holders in connection with the regulator assembly;
the electrically conductive probes are in rotatable connection with the probe holders, respectively; and
the electrically conductive probes elastically abut against the conducting wire when the electrically conductive assembly is located at the contact position.

8. The detection mechanism according to claim 7, wherein
the electrically conductive probes are in rotatable connection with the probe holders, respectively;
the electrically conductive assembly further comprises at least two first elastic members in connection with the electrically conductive probes, respectively; and
the at least two first elastic members are configured to be elastically deformed and provide elastic forces to restore the electrically conductive probes, respectively, when the electrically conductive assembly is located at the contact position.

9. The detection mechanism according to claim 1, wherein
the displacement driver is configured to drive the electrically conductive assembly and the regulator assembly to move along a straight line, and to enable the electrically conductive assembly to switch between the separated position and the contact position.

* * * * *